(12) United States Patent
Liao et al.

(10) Patent No.: US 8,507,338 B2
(45) Date of Patent: Aug. 13, 2013

(54) SEMICONDUCTOR STRUCTURE AND FABRICATING METHOD THEREOF

(75) Inventors: Duan-Quan Liao, Singapore (SG);
Yi-Kun Chen, Singapore (SG);
Xiao-Zhong Zhu, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 25 days.

(21) Appl. No.: 13/204,808

(22) Filed: Aug. 8, 2011

(65) Prior Publication Data
US 2013/0037889 A1 Feb. 14, 2013

(51) Int. Cl.
*H01L 21/8238* (2006.01)
*H01L 29/94* (2006.01)

(52) U.S. Cl.
USPC ........... 438/199; 438/183; 438/203; 438/275; 438/589; 257/369; 257/394; 257/404; 257/411; 257/E21.444; 257/E21.621; 257/E21.634; 257/E29.255

(58) Field of Classification Search
USPC ......... 438/183, 199, 203, 275, 589; 257/369, 257/257/394, 404, 411, E21.444, E21.621, 257/E21.634, E29.255
See application file for complete search history.

(56) References Cited

U.S. PATENT DOCUMENTS

| | | | | |
|---|---|---|---|---|
| 6,492,249 B2 * | 12/2002 | Xiang et al. | ................... | 438/586 |
| 6,563,178 B2 * | 5/2003 | Moriwaki et al. | ............ | 257/369 |
| 6,736,888 B1 * | 5/2004 | James | ......................... | 106/31.46 |
| 6,908,801 B2 * | 6/2005 | Saito | ............................. | 438/199 |

* cited by examiner

*Primary Examiner* — Dao H Nguyen
(74) *Attorney, Agent, or Firm* — Ding Yu Tan

(57) ABSTRACT

A fabricating method of semiconductor structure is provided. First, a substrate with a dielectric layer formed thereon is provided. The dielectric layer has a first opening and a second opening exposing a portion of the substrate. Further, a gate dielectric layer including a high-k dielectric layer and a barrier layer stacked thereon had been formed on the bottoms of the first opening and the second opening. Next, a sacrificial layer is formed on the portion of the gate dielectric layer within the second opening. Next, a first work function metal layer is formed to cover the portion of the gate dielectric layer within the first opening and the sacrificial layer. Then, the portion of the first work function metal layer and the sacrificial layer within the second opening are removed.

8 Claims, 5 Drawing Sheets

SEMICONDUCTOR STRUCTURE AND FABRICATING METHOD THEREOF

BACKGROUND

1. Field of the Invention

The present invention relates to a semiconductor structure and a fabricating method thereof, and especially to a semiconductor structure and a fabricating method thereof which can improve the electrical performance of metal gate transistor.

2. Description of Related Art

In the field of semiconductor fabrication, the use of polysilicon material is diverse. Having a strong resistance for heat, polysilicon materials are commonly used to fabricate gate electrodes for metal-oxide semiconductor transistors. The gate pattern fabricated by polysilicon materials is also used to form self-aligned source/drain regions as polysilicon readily blocks ions from entering the channel region.

However, devices fabricated by polysilicon still have many drawbacks. In contrast to most metal, polysilicon gates are fabricated by semiconductor materials having higher resistance, which causes the polysilicon gate to work under a much lower rate than the metal gates. On the other hand, the conventional polysilicon gate also has faced problems such as unavoidable depletion effect which increases equivalent thickness of the gate dielectric layer, reduces gate capacitance, and worsens a driving force of the devices. Thus, work function metals are developed to replace the conventional polysilicon gate to be the control electrode.

With a trend towards scaling down the MOS size, conventional methods, which are used to achieve optimization, such as reducing thickness of the gate dielectric layer, for example the thickness of silicon dioxide layer, have faced problems such as leakage current due to tunneling effect. In order to keep progression to next generation, high-k materials are used to replace the conventional silicon oxide to be the gate dielectric layer because it decreases physical limit thickness effectively, reduces leakage current, obtains equivalent capacitor in an identical equivalent oxide thickness (EOT), and can be competent to the work function metals.

Materials of the work function metal gates should well operate in both an N-type metal oxide semiconductor (NMOS) device and a P-type metal oxide semiconductor (PMOS) device. Accordingly, compatibility and process control for the metal gate are more complicated, meanwhile thickness and composition controls for materials used in the metal gate method have to be more precise. It is still a challenge to form an optimized work function metal gate to improve the performance of MOS transistors.

BRIEF SUMMARY

Therefore, the present invention is direct to a semiconductor structure and a fabricating method thereof, so the electrical performance of metal gate transistor can be improved.

The present invention provides a fabricating method of a semiconductor structure. First, a substrate with a dielectric layer formed thereon is provided. The dielectric layer has a first opening and a second opening exposing a portion of the substrate. Further, a plurality of first doped regions had been formed in the substrate and located at two sides of the first opening. Also, a plurality of second doped regions had been formed in the substrate and located at two sides of the second opening. Moreover, a gate dielectric layer had been formed on the bottom of the first opening and the second opening. The gate dielectric layer includes a high-k dielectric layer and a barrier layer stacked thereon. Next, a sacrificial layer is formed on the portion of the gate dielectric layer within the second opening. Next, a first work function metal layer is formed to cover the portion of the gate dielectric layer within the first opening and the sacrificial layer. Then, the portion of the first work function metal layer and the sacrificial layer within the second opening are removed.

In one embodiment of present invention, the method further includes the step of forming a second work function metal layer on the portion of the gate dielectric layer within the second opening after removing the first work function metal layer and the sacrificial layer within the second opening.

In one embodiment of present invention, the method further includes the step of forming a first-type doped well and a second-type doped well in the substrate before forming the dielectric layer, the gate dielectric layer, the first doped region and the second doped region, wherein the first opening is formed above the first-type doped well, the second opening is formed above the second-type doped well, the first doped regions are formed in the first-type doped well and the second doped regions are formed in the second-type doped well.

In one embodiment of present invention, the first-type doped well is an N-type doped well and the second-type doped well is a P-type doped well.

In one embodiment of present invention, the dielectric layer includes a plurality of spacers formed at two sides of the first opening and the second opening.

In one embodiment of present invention, the gate dielectric layer further covers sidewalls of the first opening and the second opening, and extends on the dielectric layer.

In one embodiment of present invention, the gate dielectric layer further includes an interfacial layer formed between the substrate and the high-k dielectric layer.

In one embodiment of present invention, the material of the sacrificial layer comprises polysilicon.

The invention provides a semiconductor structure including a substrate, a dielectric layer, gate dielectric layer and a first work function metal layer. A plurality of first doped regions are formed in the substrate. The dielectric layer has a first opening and the first doped regions are formed within the substrate at two sides of the first opening. The gate dielectric layer includes a high-k dielectric layer and a barrier layer sequentially stacked on the bottom of the first opening. The first work function metal layer is disposed on the gate dielectric layer.

In one embodiment of present invention, the semiconductor structure further includes a plurality of second doped regions formed within the substrate and a second work function metal layer. The dielectric layer further has a second opening, and the second doped regions are disposed in the substrate at two sides of the second opening. The gate dielectric layer is further disposed in the second opening and the second work function metal layer is formed thereon.

In one embodiment of present invention, the second work function metal layer is further disposed on the first work function metal layer within the first opening.

In one embodiment of present invention, the substrate further has a first-type doped well and a second-type doped well formed therein, the first doped regions are disposed in the first-type doped well and the second doped regions are disposed in the second-type doped well.

In one embodiment of present invention, the first-type doped well is an N-type doped well and the second-type doped well is a P-type doped well.

In one embodiment of present invention, the dielectric layer comprises a plurality of spacers disposed at two sides of the first opening.

In one embodiment of present invention, the gate dielectric layer further covers the sidewalls of the first opening and extends on the dielectric layer.

In one embodiment of present invention, the gate dielectric layer further includes an interfacial layer formed between the substrate and the high-k dielectric layer.

In one embodiment of present invention, the material of the interfacial layer comprises oxide.

In one embodiment of present invention, the material of the barrier layer comprises metal nitride, such as titanium nitride or tantalum nitride.

In the invention, a sacrificial layer is formed on the gate dielectric layer before forming the first work function metal layer to prevent the portion of the gate dielectric layer within second opening from contacting with the first work function metal layer formed later. Since there is a large etching selectivity between the sacrificial layer and the gate dielectric layer, the gate dielectric layer can prevent damage while removing the sacrificial layer in the first opening. Moreover, before forming the second work function metal layer, the first work function metal layer and the sacrificial layer located within the second opening are removed. That is, in the semiconductor structure formed according to the method mentioned in the invention, since the work function metal layer is directly disposed on the gate dielectric layer, the electrical performance of the transistor formed later may be improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Hereinafter, preferred embodiments of the present invention will be described in detail with reference to the accompanying drawings. Here, it is to be noted that the present invention is not limited thereto. Furthermore, the step serial numbers concerning the saturation adjustment method are not meant thereto limit the operating sequence, and any rearrangement of the operating sequence for achieving same functionality is still within the spirit and scope of the invention. The like numbered numerals designate similar or the same parts, regions or elements. It is to be understood that the drawings are not drawn to scale and are served only for illustration purposes.

Figure 1A:
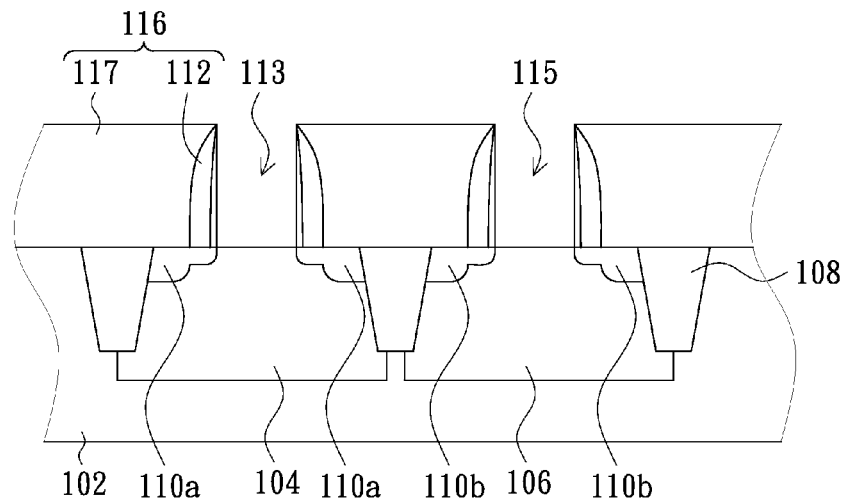
FIGS. 1A-1E illustrate cross-section views of a semiconductor structure during the fabricating process thereof according to an embodiment of the present invention.

FIGS. 1A-1E illustrate cross-section views of a semiconductor structure during the fabricating process thereof according to an embodiment of the present invention. Referring to FIG. 1A, a substrate 112, such as a silicon substrate, a silicon-containing substrate, or a silicon-on-insulator (SOI) substrate, is provided. Furthermore, a first-type doped well 104 and a second-type doped well 106 may formed in the substrate 102. Also, a plurality of first doped regions 110a are formed in the first-type doped well 104 and a plurality of second doped regions 110b are formed in the second-type doped well. Specifically, the first-type doped well 104 is, for example, an N-type doped well and the second-type doped well 106 is, for example, a P-type doped well. It means that a PMOS transistor may be formed on the first-type doped well 104 and an NMOS transistor may be formed on the second-type doped well 106 in this embodiment. Therefore, the first doped regions 110a can be source/drain of PMOS transistor and the second doped regions 110b can be source/drain of NMOS transistor.

For convenience, the first-type doped well 104 is deemed an N-type doped well and the second-type doped well 106 is deemed a P-type doped well in the following paragraphs, but it is not limited hereto. In other embodiments, the first-type doped well 104 also may be a P-type doped well and the second-type doped well 106 may be an N-type doped well.

Further, a dielectric layer 116 had been formed on the substrate 102. In this embodiment, the dielectric layer 116 includes a plurality of spacers 112 and a covering layer 117. The first opening 113 and the second opening 115 are defined in the dielectric layer 116 by the spacers 112. Moreover, the first opening 113 corresponds to the first-type doped well 104 and the second opening 115 corresponds to the second-type doped well 106. The first doped regions 110a are disposed in the substrate 102 at two sides of the first opening 113 and the second doped regions 110b are disposed in the substrate 102 at two sides of the second opening 115. The spacer 112 are located at two sides of the first opening 113 and the second opening 115 and located above the first doped regions 110a and the second doped regions 110b.

Figure 1B:
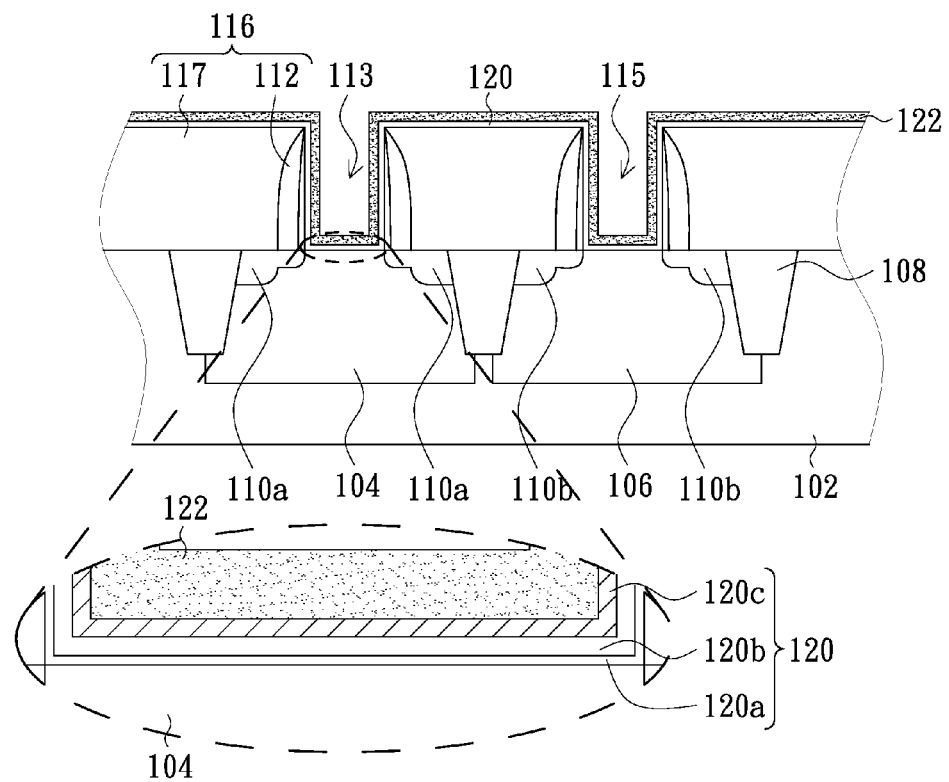

As shown in FIG. 1B, a gate dielectric layer 120 is formed on the bottoms of the first opening 113 and the second opening 115. In this embodiment, the gate dielectric layer 120 includes a high-k dielectric layer 120b and a barrier layer 120c sequentially stacked on the substrate. Furthermore, the gate dielectric layer 120 may also includes an interfacial layer 120a disposed between the high-k dielectric layer 120b and the substrate 102. The interfacial layer 120a is used for increasing the adhesion between the high-k dielectric layer 120b and the substrate 102. The material of the interfacial layer 120a can be oxide, such as silicon dioxide.

The method of forming the mentioned elements in/on the substrate would be described in the following paragraphs, but the invention is not limited hereto.

A doping process is performed to form the first-type doped well 104 and the second-type doped well 106 in the substrate 102. Next, a plurality of isolation structures 118, such as field oxide layers or shallow trench isolation (STI) structures, are formed in the substrate 112 by utilizing a local oxidation (LOCOS) process or a shallow trench isolation process. Some of the isolation structures 108 may surround and insulate the active component on the first-type doped well 104 and the second-type doped well 106. Then, a plurality of dummy gate structures are formed on the first-type doped well 104 and the second-type doped well 106, and then the first doped regions 110a and the second doped regions 110b are formed in the substrate 102 at two sides of the dummy gate structures by performing a doping process through using the dummy gate structures as doping mask.

Next, the spacers 112 are formed at the sides of the dummy gate structures and the covering layer 117 is formed on the substrate 102 exposed by the dummy gate structures and the spacers 112. Then, the dummy gate structures are removed, therefore the structure shown in FIG. 1A is formed.

Referring to FIG. 1B, in this embodiment, the conformal gate dielectric layer 120 is formed on the dielectric layer 116 and filled in the first opening 113 and the second opening 115 after forming the dielectric layer 116 with the first opening 113 and the second opening 115, so the bottoms and the sidewalls of the first opening 113 and the second opening 115 all are covered by the gate dielectric layer 120. Moreover, the gate dielectric layer 120 also extends on the dielectric layer 116.

In this embodiment, the gate dielectric layer 120 may include an interfacial layer 120a disposed on the substrate 102, a high-k material layer 120b disposed on the interfacial layer 120a and a barrier layer 120c disposed on the high-k material layer 120b. The interfacial layer 120a may be formed by a thermal oxidation process or a chemical vapor deposition (CVD) process, and may include a silicon dioxide layer. Afterwards, the high-k material layer 120b is formed on the interfacial layer 120a, and may include $SiO_2$, $Si_3N_4$, $Al_2O_3$, $Ta_2O_5$, $Y_2O_3$, $HfSiO_4$, $HfO_2$, $La_2O_3$, $ZrO_2$, $SrTiO_3$, $ZrSiO_4$ or a combination thereof. In addition, a barrier layer 120c is formed on the gate dielectric layer 122 to prevent reactions between the high-k material layer 120b and the following-formed work function metal layer and/or used to adjust the work function of the entirety of gate, and are not limited thereof. In other embodiments, the barrier layer 120c may be formed by metal nitride, such as titanium nitride (TiN) or tantalum nitride (TaN).

Figure 1C:
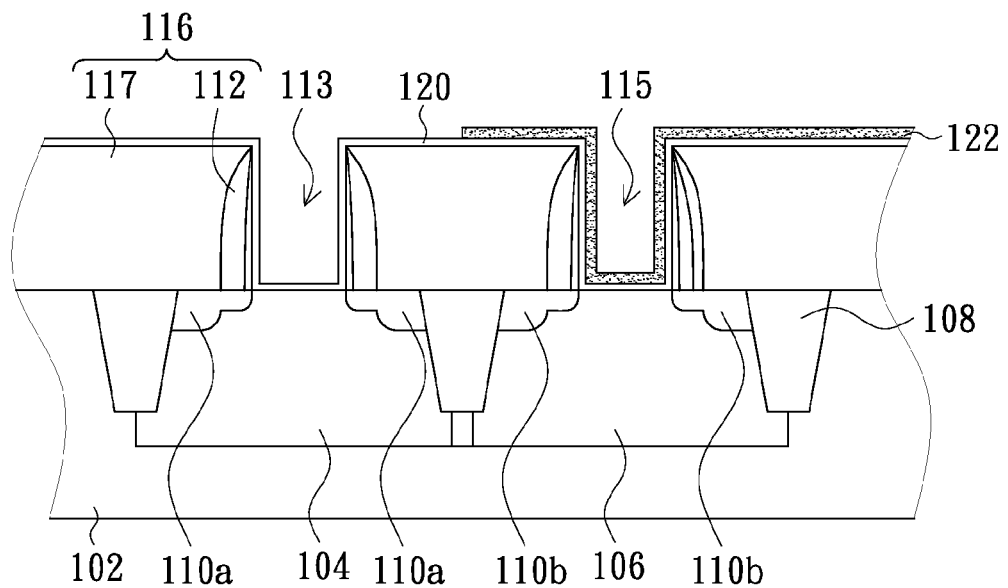

As shown in FIG. 1B, a conformal sacrificial layer 122 is formed on the gate dielectric layer 120 to cover the gate dielectric layer 120 within the first opening 113 and the second opening 115. In detail, the material of the sacrificial layer 122 may be polysilicon. Then, as shown in FIG. 1C, a portion of the sacrificial layer 122 within the first opening 113 is removed. In this embodiment, the method for removing the portion of the sacrificial layer 122 includes the following steps. First, a patterned photoresist layer (not shown in FIG. 1C) is formed on the dielectric layer 116 to cover the dielectric layer 116 above the second-type doped well 106 and filling into the second opening 115. Next, an etching process is performed by using the patterned photoresist layer as a mask to remove the portion of the sacrificial layer 122 in the first opening 113. Then, the patterned photoresist layer is removed.

In this embodiment, the material of the sacrificial layer 122 is polysilicon, the material of the top layer of the gate dielectric layer 120, that is barrier layer 120c, is metal nitride, and the etching solution, such as dilute alkylammonium hydroxide (($CH_3)_4NOH$), may used to etch the portion of the sacrificial layer 122 in the first opening 113. In this case, the etch selectivity between the sacrificial layer 122 and the barrier layer 120c is about 10-100. Accordingly, the damage of the barrier layer 120c resulted from over etching during the etching process of the sacrificial layer 122 may be prevented.

Figure 1D:
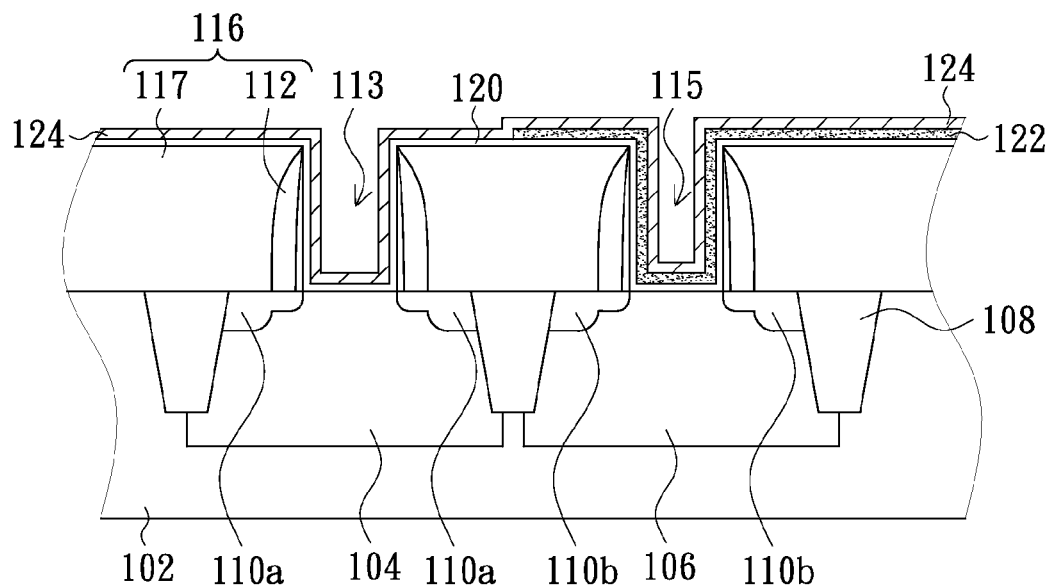

Referring to FIG. 1D, a conformal first work function metal layer 124 is formed on the dielectric layer 116 to cover the gate dielectric layer 120 in the first opening 113. Furthermore, the first work function metal layer 124 also covers the sacrificial layer 122 in the second opening 115. Specifically, a process, such as a CVD process, a physical vapor deposition (PVD) process, an atomic layer deposition (ALD) process, a sputtering process or plasma enhanced chemical vapor deposition (PECVD) process, may be performed to form a conformal first work function metal layer 124 on the dielectric layer 116. The first work function metal layer 124 may be a P-type work function metal in this embodiment, and the first work function metal layer 124 may be a single layer structure or a multiple-layer structure.

As the aforementioned, the first work function metal layer 124 may include a material with a resistance lower than 100 μ-ohm-cm, such as pure metal, metal alloy, metal oxide, metal nitride, metal oxynitride, metal silicides, metal carbide or other metal compounds. For example, the first work function metal layer 124 may preferably include titanium nitride (TiN), tantalum nitride (TaN), tantalum carbide (TaC) or tungsten nitride (WN). In addition, an ion implanting process or a surface treatment may be performed on the work function metal layer, the process recipes of the work function metal layer may be adjusted, the number of the work function metal may be increase or decrease in the present invention to provide proper work function value or other needed characteristics for different types of transistors.

Figure 1E:
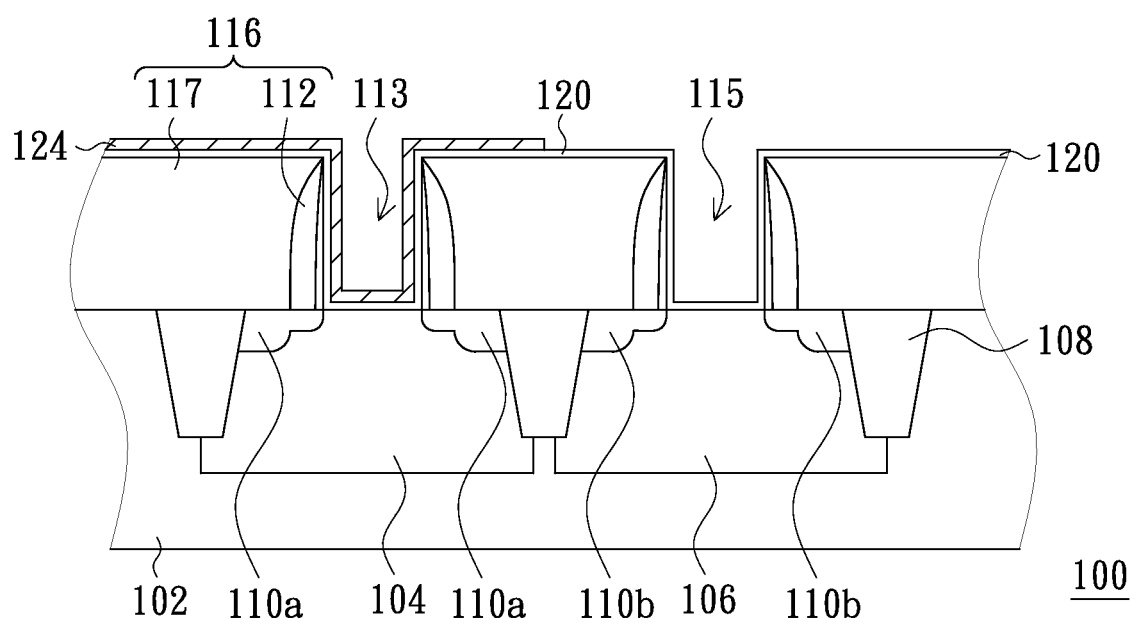

Referring to FIG. 1E, the portion of the first work function metal layer 124 above the second-type doped region 106 is removed. In this embodiment, the method for removing the portion of the first work function metal layer 124 may be photolithographic and etching process. In detail, a patterned photoresist layer (not shown in FIG. 1E) is formed on a portion of the first work function metal layer 124, and then the first work function metal layer 124 is etched by using the patterned photoresist layer as a mask. Therefore, the portion of the first work function metal layer 124 above the second-type doped region 106 may be removed. For example, if the material of the first work function metal layer 124 is titanium nitride, a mixture of sulfuric acid and the hydrogen peroxide solution can be used as an etching solution in the etching process to etch the first work function metal layer. Moreover, the sacrificial layer 122 within the second opening 115 may also removed to expose the gate dielectric layer 120 within the second opening 115 by using the patterned photoresist layer as an etching mask. As the mentioned, the etching solution used in the etching process may be dilute alkylammonium hydroxide. Then, the patterned photoresist layer is removed to form the semiconductor structure 100.

For the semiconductor structure 100, a metal layer (not shown in FIG. 1E) may be filled into the first opening 113 later to be a metal gate. Accordingly, a PMOS transistor can be formed on the first-type doped well 104. Furthermore, the metal layer filled into the first opening 113 is, for example, titanium aluminum alloy or multi-layer comprising titanium and aluminum with low resistance.

Figure 2:
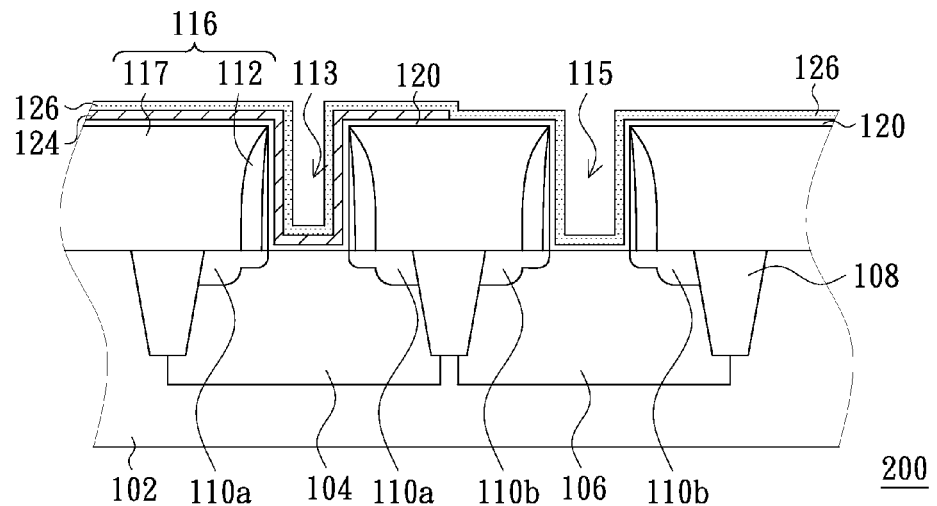
FIG. 2 illustrates a cross-section view of a semiconductor structure according to another embodiment of the present invention.

Moreover, a second work function metal layer 126 can be formed on the first work function metal layer 124 of the semiconductor structure 100, as shown in FIG. 2. The second work function metal layer 126 is filled into the second opening 115 and covers the gate dielectric layer 120 within the second opening 115. Accordingly, a complementary metal oxide semiconductor (CMOS) device is formed on the substrate 102. In this embodiment, the second work function metal layer 126 is N-type work function metal layer and the material thereof may by titanium aluminide.

After the semiconductor structure 200 is formed, a metal layer, such as titanium aluminum alloy, can be filled into the first opening 113 and the second opening 115 at the same time to be the metal gates of the PMOS transistor formed on the first-type doped well 104 and the NMOS transistor formed on the second-type doped well 106, and a CMOS transistor is composed of the PMOS transistor and the NMOS transistor.

As shown in FIG. 2, there is few layers formed between the high-k dielectric layer 120b of the gate dielectric layer 120 and the first work function metal layer 124/second work function metal layer 126 in the semiconductor structure 200, so that the threshold voltage of the transistor formed later would be reduced and the electrical performance of the transistor can be improved.

Figure 3:
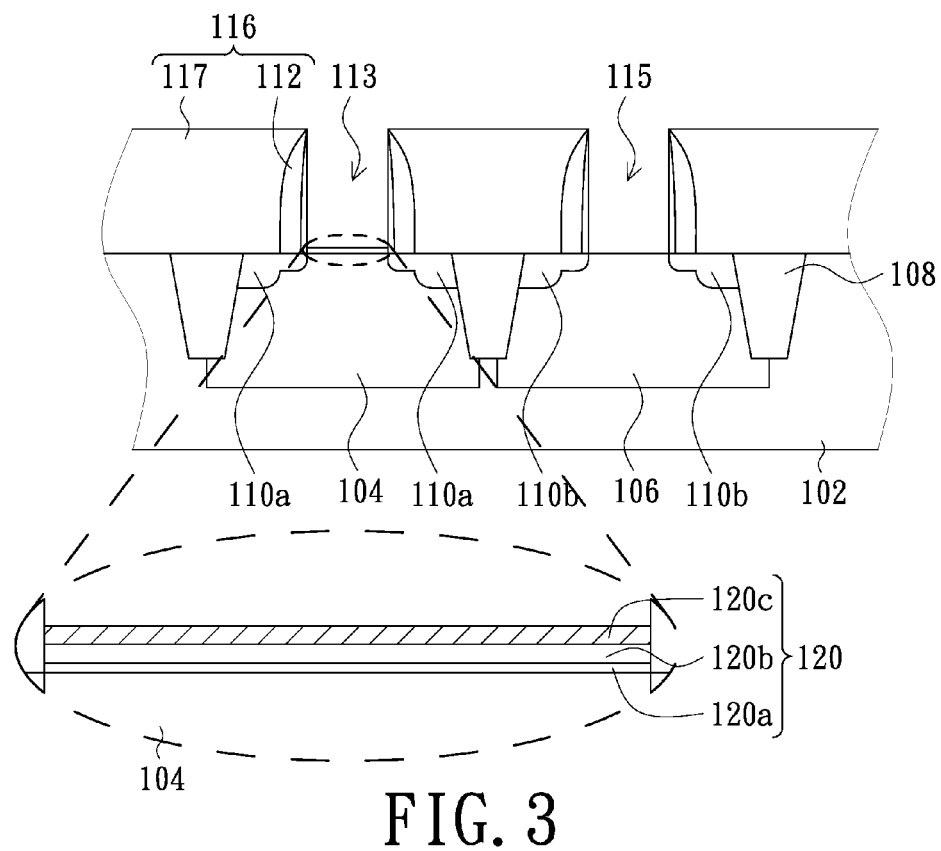
FIGS. 3-4 illustrate cross-section views of a semiconductor structure during a part of fabricating process thereof according to another embodiment of the present invention.
Figure 4:
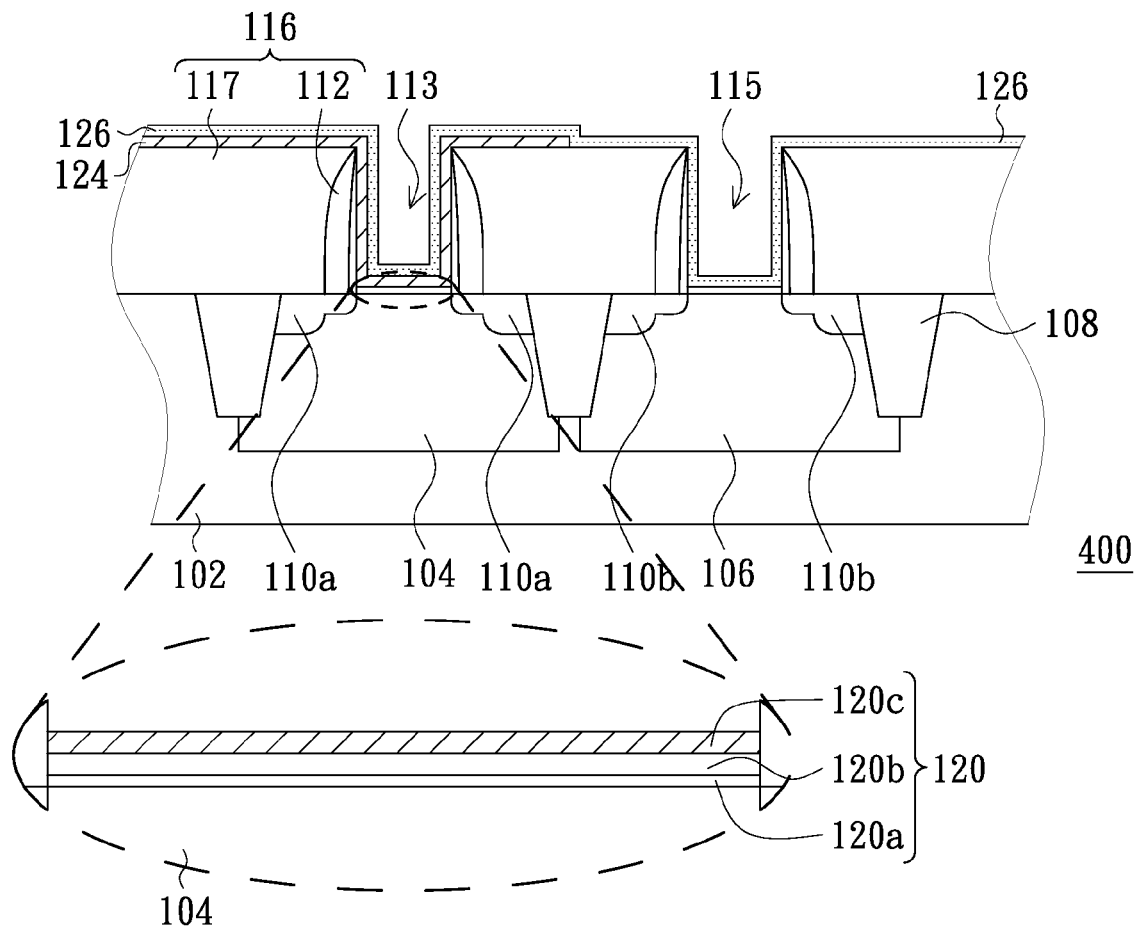

Although the dielectric layer 116 with the first opening 113 and the second opening 115 is formed on the substrate 102 before forming the gate dielectric layer 120 filling into the first opening 113 and the second opening 115, but the invention is not limited hereto. FIGS. 3-4 illustrate cross-section views of a semiconductor structure during a part of fabricating process thereof according to another embodiment of the present invention. Referring to FIG. 3, the gate dielectric layer 120 may formed on the substrate 102 firstly, and then the gate dielectric layer 120 is patterned while forming the dummy gate structure (not shown). Accordingly, the gate dielectric layer 120 only remained on the bottoms of the first opening 113 and the second opening 115 after forming the dielectric layer 116 and removing dummy gate structure. Referring to FIG. 4, the following process is similar to or the same with the process as shown in FIG. 1B to FIG. 1E, therefore the first work function metal layer 124 is formed on the portion of the gate dielectric layer 120 within the first opening 113 and the second work function metal layer 126 is formed on the portion of the gate dielectric layer 120 within the second opening 115.

As shown in FIG. 4, the difference between the semiconductor structure 400 and the semiconductor structure 200 shown in FIG. 2 is: in the semiconductor structure 400, the gate dielectric layer 120 only covers the bottoms of the first opening 113 and the second opening 115. Other elements of the semiconductor structure 400 and the semiconductor structure 200 are the same.

In summary, a sacrificial layer is formed on the gate dielectric layer before forming the first work function metal layer to prevent the portion of the gate dielectric layer within second opening from contacting with the first work function metal layer formed later. Since there is a large etching selectivity between the sacrificial layer and the gate dielectric layer, the gate dielectric layer can prevent damage while removing the sacrificial layer in the first opening. Moreover, before forming the second work function metal layer, the first work function metal layer and the sacrificial layer located within the second opening are removed. That is, in the semiconductor structure formed according to the method mentioned in the invention, since the work function metal layer is directly disposed on the gate dielectric layer, the electrical performance of the transistor formed later may be improved.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A fabricating method of semiconductor structure, comprising the steps of:
    providing a substrate with a dielectric layer and a gate dielectric layer formed thereon, and a plurality of first doped regions and a plurality of second doped regions formed therein, wherein the dielectric layer has a first opening and a second opening exposing a portion of the substrate, the first doped regions are respectively formed in the substrate at two sides of the first opening and the second doped regions are respectively formed in the substrate at two sides of the second opening, the gate dielectric layer comprising a high-k dielectric layer and a barrier layer sequentially stacked on bottoms of the first opening and the second opening;
    forming a sacrificial layer on a portion of the gate dielectric layer within the second opening, a material of the sacrificial layer comprising polysilicon;
    forming a first work function metal layer on a portion of the gate dielectric layer within the first opening and the sacrificial layer; and
    removing the first work function metal layer and the sacrificial layer within the second opening.

2. The method recited in claim 1, further comprises the step of forming a second work function metal layer on the portion of the gate dielectric layer within the second opening.

3. The method recited in claim 1, further comprises the step of forming a first-type doped well and a second-type doped well in the substrate before forming the dielectric layer, the gate dielectric layer, the first doped region and the second doped region, wherein the first opening is formed above the first-type doped well, the second opening is formed above the second-type doped well, the first doped regions are formed in the first-type doped well and the second doped regions are formed in the second-type doped well.

4. The method recited in claim 3, wherein the first-type doped well is an N-type doped well and the second-type doped well is a P-type doped well.

5. The method recited in claim 1, wherein the dielectric layer comprises a plurality of spacers formed at two sides of the first opening and the second opening.

6. The method recited in claim 1, wherein the gate dielectric layer further covers sidewalls of the first opening and the second opening, and extends on the dielectric layer.

7. The method recited in claim 1, wherein the gate dielectric layer further comprises an interfacial layer formed between the substrate and the high-k dielectric layer.

8. The method recited in claim 1, wherein the barrier layer being titanium nitride or tantalum nitride.

* * * * *